US006489044B1

(12) United States Patent
Chen et al.

(10) Patent No.: US 6,489,044 B1
(45) Date of Patent: Dec. 3, 2002

(54) PROCESS FOR FABRICATING POLARIZED ORGANIC PHOTONICS DEVICES, AND RESULTANT ARTICLES

(75) Inventors: Xiaochun Linda Chen, Parsippany, NJ (US); Zhenan Bao, North Plainfield, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/394,524

(22) Filed: Sep. 10, 1999

(51) Int. Cl.$^7$ .................. H05B 33/14; G02F 1/1335; H01L 25/00; H01J 40/00
(52) U.S. Cl. .................. 428/690; 917/704; 917/212; 313/503; 313/504; 313/506; 313/507; 313/498; 257/40; 257/103; 252/301.16; 252/301.35; 136/243; 136/257; 136/263; 349/61; 349/69; 349/70; 349/96; 349/97; 349/123; 349/125; 250/200; 250/225
(58) Field of Search .................. 428/690, 917, 428/704, 212, 447, 448, 450; 313/504, 506, 503, 507, 498; 257/40, 103; 252/301.16, 301.35; 136/243, 257, 263; 250/200, 225; 349/61, 69, 70, 96, 97, 123, 125

(56) References Cited

U.S. PATENT DOCUMENTS

| 5,180,470 A | | 1/1993 | Smith et al. | |
|---|---|---|---|---|
| 5,350,459 A | | 9/1994 | Suzuki et al. | |
| 5,454,880 A | | 10/1995 | Sariciftci et al. | |
| 5,546,889 A | | 8/1996 | Wakita et al. | |
| 5,669,708 A | * | 9/1997 | Mashima et al. | ........... 362/341 |
| 5,677,545 A | | 10/1997 | Shi et al. | |
| 5,772,755 A | * | 6/1998 | Hegenbarth et al. | .......... 117/68 |
| 5,919,579 A | | 7/1999 | Kang et al. | |

OTHER PUBLICATIONS

M. Era et al., "Polarized electroluminescence from oriented p–sexiphenyl vacuum–deposited film," 67(17) Appl.Phys. Lett 2436 (1995). No Month.

V. Cimorva et al, "Polarized Light Emission from LEDs Prepared by the Langmui–Blodgett Technique," 8(2) Adv. Mater. 146 (1996). No Month.

P. Dyreklev et al., "Polarized Electroluminescence from an Oriented Substituted Polythiophene in a Light Emitting Diode," 7(1) Adv.Mater. 43 (1995). No Month.

Wittmann et al., "Highly oriented thin films of poly(tetrafluorothylene) as a substrate for oriented growth of materials," 352 Nature 414 (1991). No Month.

Tanigaki et al., "Oriented thin films of conjugated polymers: polysilanes and polyphenylenes," 331 Thin Solid Films 229 (1998). No Month.

Ueda et al., "Structure and crystal growth of low molecular weight polyethylene vapor–deposited on polymer friction–transferred layers," 331 Thin Solid Films 216 (1998). No Month.

Hamaguchi et al, Polarized electroluminescence from rubbing–aligned poly(2,5–dinonyloxy–1,4–phenylenevinylene) films, Appl. Phys. Lett. 67(23), Dec. 4, 1995.*

Gill et al, Highly Oriented Thin Films of a Substituted Oligo(para–phenylenevinylene) on Friction–transferred PTFE Substrates, Adv. Mater. 1997, 9, No. 4 No Month.*

* cited by examiner

Primary Examiner—Deborah Jones
Assistant Examiner—Ling Xu
(74) Attorney, Agent, or Firm—Venable (57) ABSTRACT

A polarized organic photonics device, including an LED or photovoltaic device, is comprised of a first conductive layer or electrode coated with a friction transferred alignment material, a photoactive material, and a second electrically conductive layer or electrode. The alignment material provides for the orientation of the subsequently deposited photoactive material such that the photoactive material interacts with or emits light preferentially along a selected polarization axis. Additional layers and sublayers optimize and tune the optical and electronic responses of the device.

31 Claims, 9 Drawing Sheets

1G-6-OMe

*FIG. 4A*

1G-12-OMe

*FIG. 4B*

PPV12

TAPC

*FIG. 4F*

PTCDA

PROCESS FOR FABRICATING POLARIZED ORGANIC PHOTONICS DEVICES, AND RESULTANT ARTICLES

FIELD OF THE INVENTION

Photonics is the science and technology of generating and harnessing light and other forms of radiant energy whose quantum unit is the photon. The science includes light emission, transmission, deflection, amplification and detection by optical components and instruments, lasers and other light sources, fiber optics, electro-optical instrumentation, related hardware and electronics, and sophisticated systems. The range of technical applications of photonics to devices extends from energy generation to detection to communications and information processing and storage. In addition to its other properties, the polarized nature of light can be exploited to expand or improve the efficiency, utility, and specificity of photonics devices.

TECHNOLOGY REVIEW

Organic based photonics devices have been under development for more than 12 years and offer many potential advantages and opportunities for improved devices. For example, organic electroluminescence (the emission of light in response to an electrical current) has been used in display technology. In such a device, organic materials which posses the ability to emit light when electric current is passed through them are organized as thin layers between two electrodes. The emitters used in light emitting diodes (LEDs) such as these can be either small organic molecules or conjugated polymers.

Organic materials arc useful for other photonics devices as well. For example, the need to develop efficient low-cost photovoltaic devices (devices that convert light into electrical energy) has stimulated research efforts using organic materials as or as part of the photoactive media. Photovoltaic devices based on organic materials such as organic molecules and conjugated polymers are emerging as an alternative technology to more conventional approaches based on inorganic semiconductors. Compared to inorganic semiconductor counterparts, organic materials offer the advantages of high photosensitivity, high optical absorption coefficients, and compatibility with vacuum deposition, thereby possessing the potential for large area, thin-film devices that can be produced at a modest cost. Furthermore, organic materials can be deposited on flexible or shaped substrates, which may eventually lead to the development of lightweight and conformal devices.

One fascinating feature of organic materials is their potential for controlling macroscopic material properties by manipulating the order or orientation of the molecules. For example, alignment of an organic material along a given axis can yield preferential absorption and emission along that axis. LEDs using aligned photoactive materials which can emit polarized light will be particularly useful as backlights for conventional liquid crystal displays (LCDs), since in these systems 50% of the emission of an unpolarized light sources is typically lost due to polarization based filtering. In addition, control of the alignment of emissive molecules in LEDs is quite important for future advancement in emission devices, such as LEDs integrated with microcavities and waveguide structures.

Research efforts directed at achieving polarized electroluminescence by aligning the organic emitters have been reported. However, all of these approaches are non-general, have difficulty controlling film thickness and uniformity, and are time consuming. For example, there is the liquid crystal approach. Devices based on this method are inherently limited to being made from materials that are liquid crystals. Epitaxial growth on rubbed substrates is another approach that has been attempted. This method is only applicable to use with small organic molecules which can be vapor deposited. An elongation approach has also been tried; but this method is complicated and film thickness and uniformity are difficult to control. The Langmuir-Blodgett method has also been used to develop polarized electroluminescent devices; but it has limited applicability and is specifically limited to materials that are amphiphilic and are capable of forming Langmuir-Blodgett films.

Electronic organic devices developed using a poly (tetrafluoroethylene) (PTFE) oriented film as a template to provide alignment and orientation of subsequently deposited films have been reported. See Katsuya Wakita, U.S. Pat. No. 5,546,889. Such devices are, however, fundamentally limited to electronic devices such as field effect transistors because, among other reasons, the electrodes used in these devices are necessarily co-planar and hence are inapplicable to photonics devices. Moreover, because the electrodes are co-planar, it is not feasible to prepare multiple stacked layers between the electrodes. Furthermore, Wakita is limited to purely electronic devices and does not enable photonics devices since it provides for neither photoactive materials nor for any electrodes to be transparent. Absent these and other features, such a device is not suitable for photonics applications. The electronic device developed by Wakita is also unsuitable for photonics applications because it fails to overcome the problem of charge conduction through the PTFE alignment layer, which is electrically insulating. That is, it fails to answer the question of how to use a polymer, such as PTFE, for alignment without completely insulating charge conduction in an organic electronic device.

To date, polarization sensitive organic photovoltaic devices have not been reported.

For the foregoing reasons, there is a need for polarized organic photonics devices. Moreover, there is a need for a processing method that is simple and fast, applicable to a variety of organic and polymeric materials, yields high optical quality films, and easily achieves thickness of a few tens of nanometers.

SUMMARY OF THE INVENTION

The present invention is directed to polarized organic photonics devices, and process for production thereof, that satisfies the need for polarized organic photonics devices, and processes for production thereof, as well as other needs.

The process for fabricating a polarized organic photonics device beings with preparing a alignment layer on top of a first conducting layer or conducting substrate. The first conducting layer or conducting substrate serves as a first electrode in the photonics device. The alignment layer, typically a thin layer of an insulating, electron transporting or hole transporting material, is deposited by a friction transfer method. This layer provides for the alignment of subsequently deposited organic and polymeric layers, necessary for polarized emission and absorption. Following the alignment layer, a conducting polymer may be deposited onto the alignment layer. This step may be carried out at elevated temperatures to enhance the uniformity of the deposited layer. Next, a photoactive material is deposited. As used herein, a photoactive material is a material that interacts with or emits light. This step may also be carried out at elevated temperature, to enhance uniformity and to further increase the alignment of the photoactive material to the preferred direction defined by the alignment layer. Finally, a second conductive layer is added to yield a polarized organic photonics device. The second conductive layer serves as a second electrode in the photonics device.

Specific advantages of the present invention include, among others, the following:

(i) A simple method of generalized applicability for creating polarized organic photonics devices.

(ii) Organic photonics devices with enhanced efficiency due to the polarized response of aligned photoactive material.

(iii) Organic photonics devices with enhanced selectivity due to the polarized response of the aligned photoactive material.

(iv) The ability to simultaneously align organic or polymeric species using a layer of a alignment material that may be electrically insulating without eliminating charge conduction through the alignment layer.

DETAILED DESCRIPTION OF THE INVENTION

The polarized organic devices described herein and the methods for their fabrication are based on forming a sequence of stacked layers of selected materials in a selected order. The thickness of each of the layers depends on the material and the intended device application. For the limited purpose of describing the layer ordering and the structure of the photonics devices and their formation, except where specified otherwise, layers as used herein are understood to be quasi 2-dimensional objects such that they essentially have only two surfaces. Thus, when, for example, layer B is formed or deposited on an outer surface of layer A, only one outer surface of layer B remains exposed. Then, if layer C is subsequently formed on an outer surface of layer B it is understood that the configuration described is a sequence of three layers stacked in the unique order A-B-C. Additionally, it is understood that any layer, unless specified otherwise, may consist of a sequence of sublayers.

The process for fabricating a polarized organic photonics device comprises the steps of preparing a sequence of stacked layers by first forming an alignment layer on top of a first conducting layer or conducting substrate. The first conducting layer or substrate serves as a first electrode in the photonics device. The alignment layer provides an alignment template and direction to orient photoactive materials, which are subsequently deposited onto the previous layer or layers. A second conducting layer (which serves as a second electrode in the photonics device), thereby forming a polarized organic photonics device.

The alignment layer provides for the alignment of subsequently deposited organic and polymeric layers, a prerequisite for a polarized device. The alignment layer, typically a thin layer of an insulating, electron transporting, or hole transporting material, is deposited by a friction transfer method. In one preferred embodiment, the alignment material is poly(tetrafluoroethylene) (PTFE). The alignment layer may be other materials as well. Another suitable material is poly(phenylene) (PPP). U. Ueda et al. 331 Thin Solid Films 216 (1998), incorporated herein by reference, teaches that ultra-high molecular weight polyethylene (UHMWPE) may be used as an alignment layer. F. Motamedi 32 J. Polymer Sci: B 453 (1994), incorporated herein by reference, teach that polyethylene, the thermotropic liquid-crystalline Vectra®, and fluorinated ethylene-propylene copolymers are also suitable for the formation of oriented layers by friction transfer.

The friction transfer method used to prepared the alignment layer on the electrically conductive substrate is achieved by pressing a solid structure (pellet, bar, ingot, rod, stick or the like) of the alignment material against the substrate and drawing the solid alignment material across the structure in a selected direction under a pressure sufficient to transfer a thin layer of the alignment material onto the substrate. The selected direction of the friction transfer, typically, though not necessarily, a single linear axis, provides an orientation direction for the alignment of subsequent layers. The friction transfer method is described more fully in U.S. Pat. No. 5,180,460, which is incorporated herein by reference. The substrate may either be heated or unheated to optimize the transfer and control the thickness of the transferred alignment film. Oriented friction transfer alignment structures facilitate nucleation and formation of highly oriented structures deposited thereon. U.S. Pat No. 5,772,755, incorporated herein by reference, teaches that a thin film of PTFE also may be prepared for use as an alignment layer by spreading a powder or dispersion across the substrate. These deposition methods of U.S. Pat No. 5,772,755 is included under the scope and meaning of the friction transfer method.

The thickness of the alignment layer should be sufficient to impart alignment on subsequent layers. It should also be thin enough such that it is not completely insulating. Preferably, the average thickness of the alignment layer should be less than 10 nm. More preferably, the average thickness should be less that 1 nm.

In one preferred embodiment, following the alignment layer, an electrically conducting polymer may be deposited onto the alignment layer. This step may be carried out at elevated temperatures to enhance the uniformity of the deposited layer. Alternately, the conducting polymer may be deposited at room temperature, or below, to yield preferential deposition in regions with less PTFE, or other alignment material. In this latter method, the addition of the conducting polymer yields a more uniform base for subsequently deposited layers. This step of depositing an electrically conducting polymer may be carried out using a gaseous-phase, aerosol, casting or melt method. It is preferable that the conducting polymer is poly(3,4-ethylenedioxythiophene) (PEDOT), polyaniline, polypyrrole, or conducting polythiophene.

Next, either directly onto the alignment layer, or, in the preferred embodiment containing the alignment material and conducting polymer bi-layer structure, onto the bi-layer structure, a photoactive material is deposited. The photoactive material itself may a multi-layer structure. In one preferred embodiment, the photoactive layer consists of a photoactive material layered between a hole transporting material on one side and/or an electron transporting material on the second side. The photoactive material may also be a blend of or sequence of stacked layers of one or more photoactive materials. For example, the photoactive layer may comprise a hole transporting (p-type) layer and an electron transporting (n-type) layer having a photoactive material incorporated into one or both layers.

The photoactive material may be an organic or polymeric material. If the photoactive material is an organic molecule, it may be 1,2-bis(di-4-tolylaminophenyl)cyclohexane (TAPC) or 3,4,9,10-perylenetetracarboxylic dianhydride (PTCDA). If the photoactive material is a polymer, it may be a rigid, linear conjugated polymer. Preferably, the photoactive material may be a polymer such as poly{[2,5-bis(n-dodecan-1-yloxy)-1,4-phenylene]vinylene-1,4-phenylene vinylene} (PPV12), poly{{2-methoxy-5-[3',4',5'-tris(n-dodecan-1-yloxy)benzyloxy]-1,4-phenylene}vinylene-1,4-phenylene vinylene} (1G12-OMe), poly{{2-methoxy-5-[3',4',5'-tris(n-hexan-1-yloxy)benzyloxy]-1,4-phenylene}vinylene-1,4-phenylene vinylene} (1G6-OMe), or poly{{2,5-bis[3',4',5'-tris(n-dodecan-1-yloxy)benzyloxy]-1,4-phenylene}vinylene-1,4-phenylene vinylene} (1G12-S).

The photoactive material may also be blended or layered with other materials to enhance or modify the optical and or electronic responses of the photonics device. For embodiments of the present invention that operate by the absorption of light, such as photovoltaic devices, fullerenes are a suitable additive to the photoactive material to enhance device response. In the present invention, fullerene means a carbon allotrope, which is also called carbon cluster. The fullerenes hitherto known are those having such molecular-formulas as $C_{60}$, $C_{70}$, $C_{76}$, $C_{78}$, $C_{82}$, $C_{84}$, $C_{90}$, $C_{96}$, etc. In the present invention, a mixture can be used which comprises two or more of these fullerenes. Of these, preferred for use in the present invention are $C_{60}$ and $C_{70}$, and particularly preferred is $C_{60}$. Substituted fullerenes, fullerene derivatives, polymers comprising fullerenes or substituted fullerenes may also be blended or layered with the photoactive material.

The deposition of the photoactive material may also be carried out at elevated temperature, to enhance uniformity and to further increase the alignment of the photoactive material to the alignment layer or bi-layer. This step may be carried out by contacting the photoactive material with the alignment layer (or bi-layer structure) with the photoactive material in a gaseous phase or as an aerosol, from a solution by a casting method, or as a solid by melt processing. In one preferred embodiment, the substrate is heated to a temperature above the boiling point of the solution used to cast the photoactive material onto the alignment layer (or bi-layer structure). This method is valuable in that it induces alignment of the photoactive material beginning from the substrate.

It is preferable that the first and/or the second electrically conductive layers, both of which serve as electrodes for the device, be transparent or semi-transparent to light. Possible conductive layers include indium tin oxide (ITO) or a conducting polymer, both of which may be optically transparent. The electrically conducting layer may also be a metal film, such as gold, aluminum, silver, or copper. If this layer is to be transparent, or substantially transparent, then the metallic layer may be relatively thin and still conduct electricity but also transmit light. One of the conducting layers may also be reflective, or semi-reflective, or selectively reflective, to, for example, direct unabsorbed light back into the active material, in the case of a photovoltaic device, or to direct emitted light out of the device into a preferred direction, in the case of a LED.

The first electrically conductive layer is preferably formed on a substrate. This substrate may be optically transparent or semi-transparent to allow light to enter and/or leave the device. The substrate may be any shape. It may preferably be substantially planer, concave, or convex. The shape of the substrate, as well as its other material and optical properties, may be chosen and or designed to control the transmission and/or reflection ought into and/or out of the device by, for example, focussing, collimating, or diverging light. Additionally, the conducting layers may be conformal with a surface of any arbitrary shape.

For certain applications, such as photovoltaic devices, it is preferred that the two electrodes have different work functions.

Figure 1:
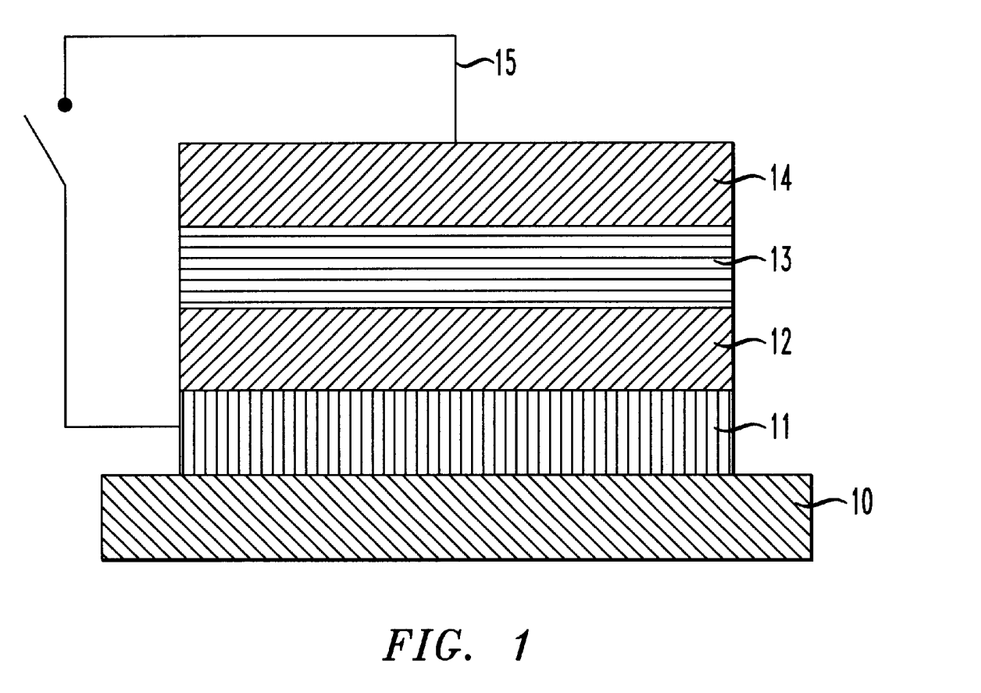
FIG. 1 shows the cross section of an embodiment of the invention as a four layer polarized organic light emitting diode.

The polarized organic photonics device may be designed to perform a number of functions. Among these functions, the device, for example, may be used as a polarized organic light emitting diode. FIG. 1 depicts one embodiment of the current invention in the form of a four layer LED. Substrate 10 serves as a support for a transparent electrically conductive electrode 11 made from ITO, which is coated with a friction transferred PTFE layer 12, and onto which a layer of photoactive material 13 has been formed, an aluminum electrode 14 is the final layer in the stacked sequence and the device can be operated as an LED by applying an electrical signal across the circuit 15 connecting the two electrodes.

Figure 2:
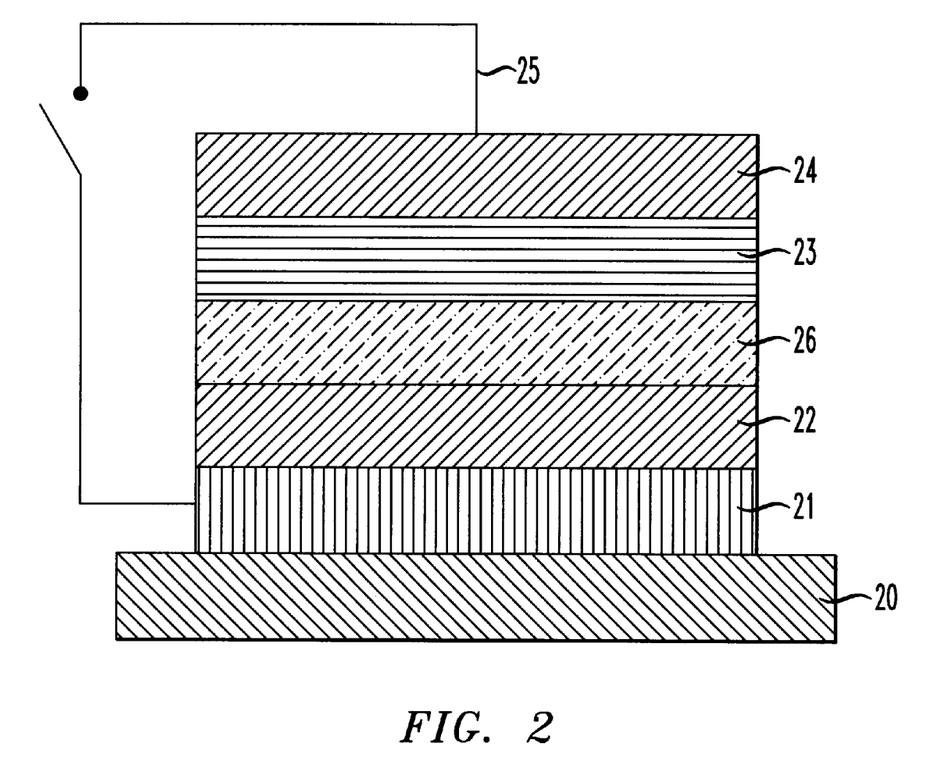
FIG. 2 shows the cross section of an embodiment of the invention as a five layer polarized organic light emitting diode, which includes a conducting polymer layered between the alignment material and the photoactive material.

FIG. 2 depicts one of the preferred embodiments of the invention in the form of a five layer LED. Substrate 20 serves as a support for a transparent electrically conductive electrode 21 made from ITO, which is coated with a friction transferred PTFE layer 22, and onto which a conducting polymer layer 26 has been formed, and onto which a layer of photoactive material 23 has been formed, an aluminum electrode 24 is the final layer in the stacked sequence and the device can be operated as an LED by applying an electrical signal across the circuit 25 connecting the two electrodes.

Figure 3:
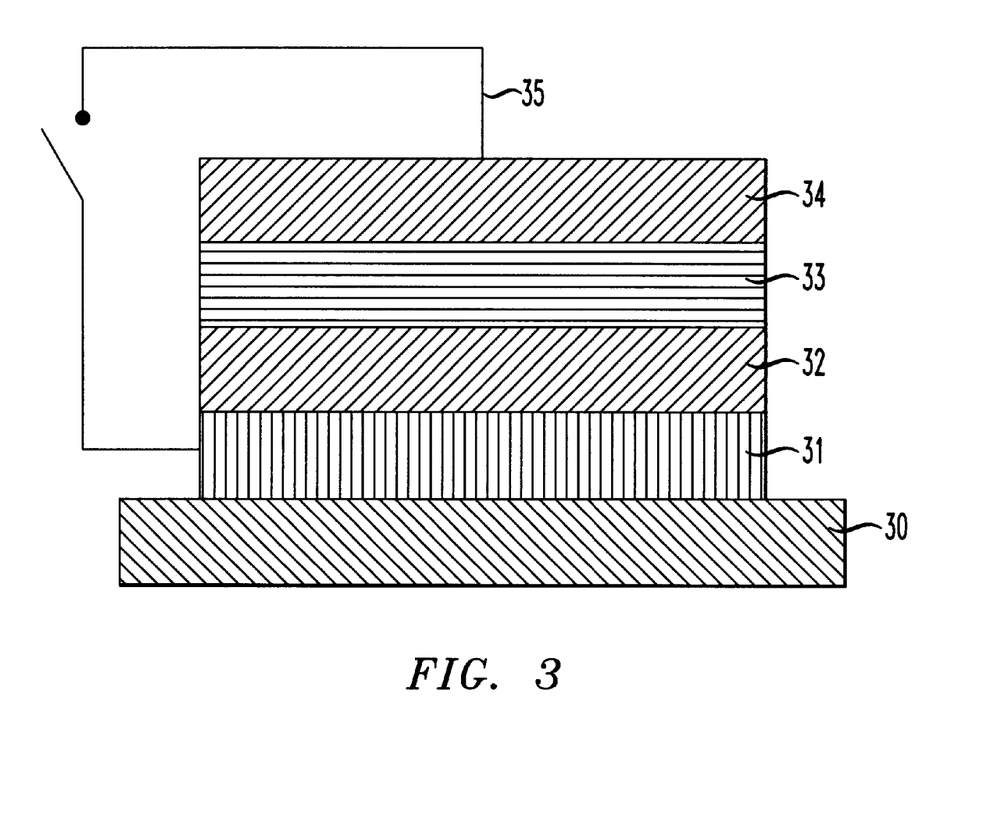
FIG. 3 shows the cross section of an embodiment of the invention as a polarized organic photovoltaic device.
Figures 4A, 4B:
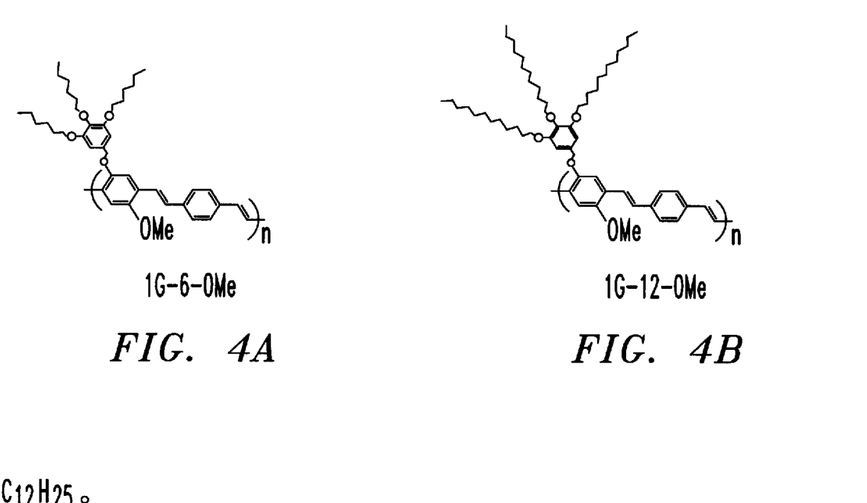
FIG. 4 shows the chemical structures of some of the species used in the polarized organic photonics devices.
Figures 4C, 4D, 4E:
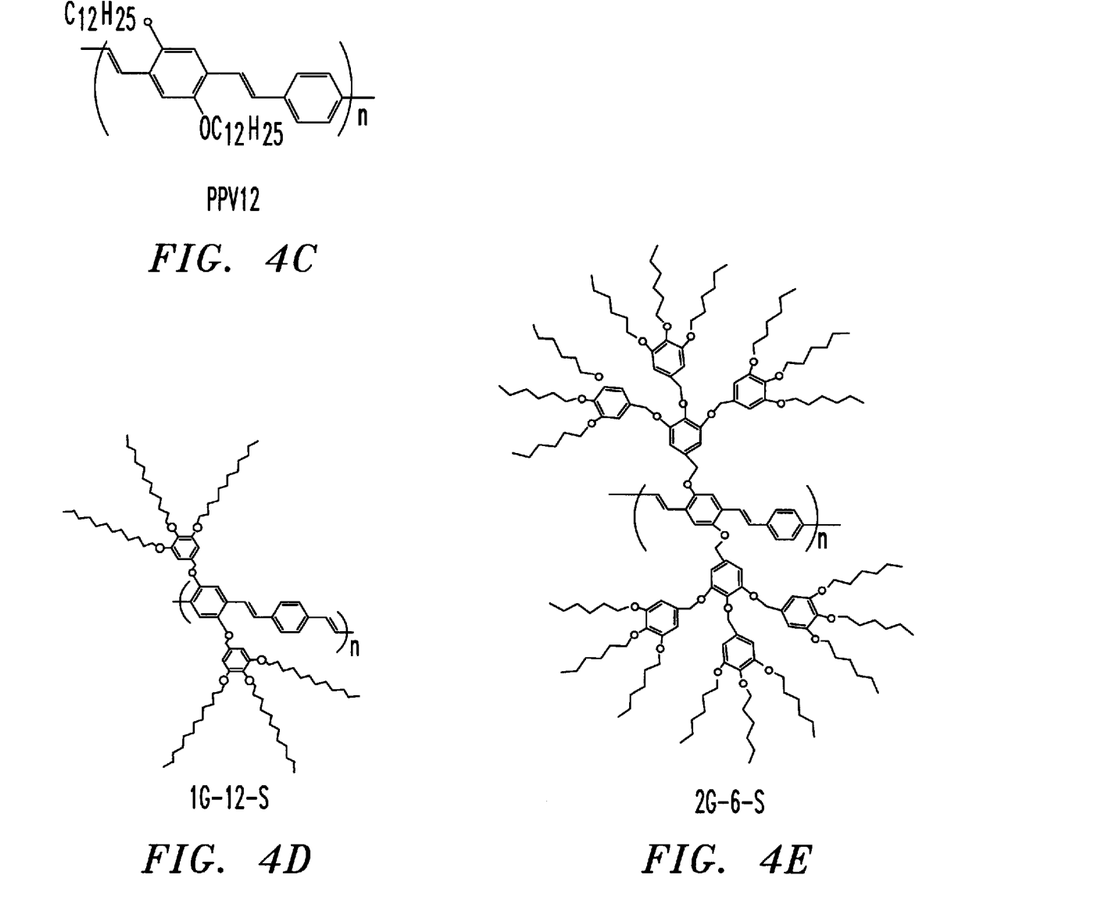
Figure 4F:
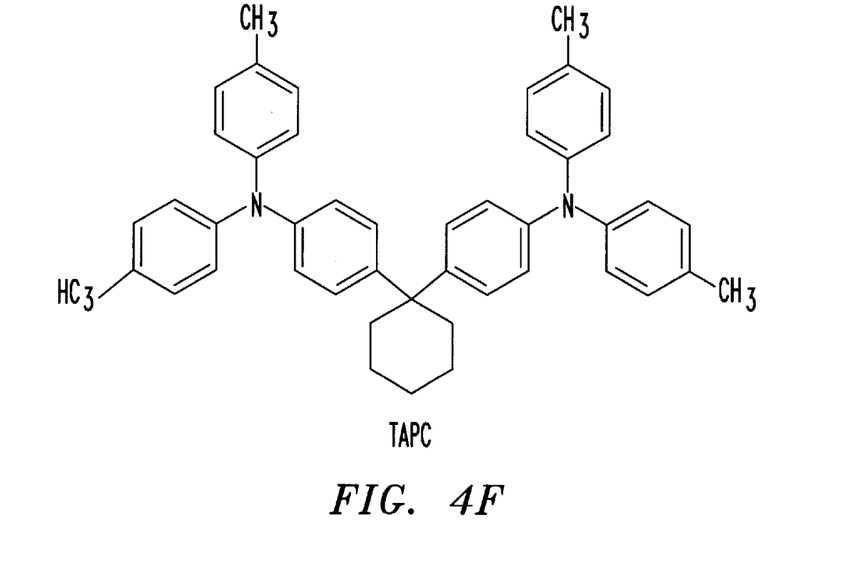
Figure 4G:
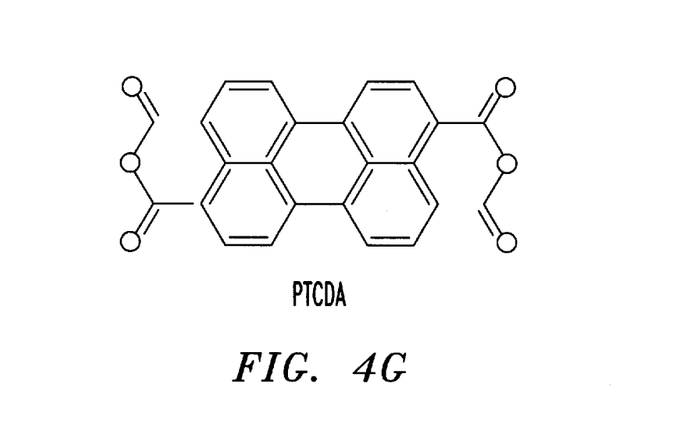
Figure 4H:
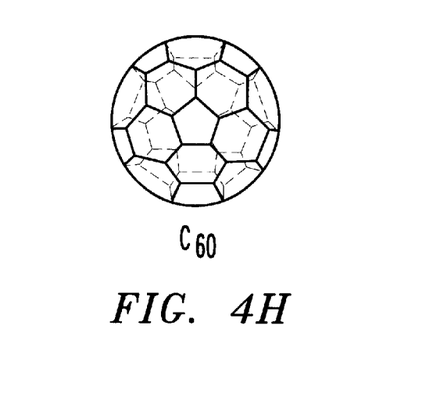

The polarized organic photonics device may also be designed to be a polarized photovoltaic device. FIG. 3 depicts one of the preferred embodiments of the invention where the device is a photovoltaic device. Light enters the device through an optically transparent substrate 30, which serves as a support for an optically transparent electrically conductive electrode 31, onto which a friction transferred PTFE layer 32 has been formed, and onto which a layer of the photoactive material 33 is formed, and with the final layer in the stacked sequence is a second electrically conductive electrode 34. A photo-induced electrical signal may be measured or an electrical load may be driven in the circuit 35, which connects the two electrodes.

FIG. 4 depicts the chemical structures of some of the chemical species that may be used in the polarized organic photonics devices of this invention.

The examples are provided for illustrative purposes only, and are not intended to limit the scope of the present invention, which is defined in the appended claims.

EXAMPLE 1

Figure 5A:
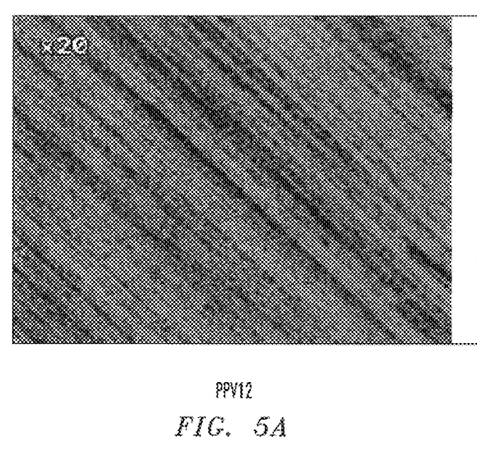
FIG. 5 shows the polarized micrographs of a photoactive polymer cast on a substrate with a friction transferred PTFE alignment layer.
Figure 5B:
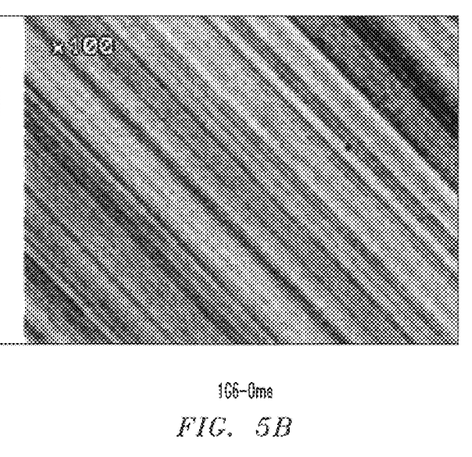

This example demonstrates the process of preparing polarized organic photoactive layers by casting on a friction transferred PTFE treated substrate. First, PTFE was rubbed on glass substrates. Photoactive polymer layers, approximately 100 nm thick, were then deposited on the PTFE treated substrates by casting from solution. Polarized micrographs of PPV12 and 1G6-OMe, the structures of which are shown in FIG. 4, prepared according to this method are shown in FIG. 5. The PTFE component is sufficiently thin and colorless and does not contribute significantly to light intensity through crossed polarizers. When the film is rotated and the PTFE friction direction is oriented parallel to the polarizer, almost complete extinction of the transmitted light is observed. This indicates that most polymers are oriented parallel to the PTFE friction transfer direction.

Figure 6:
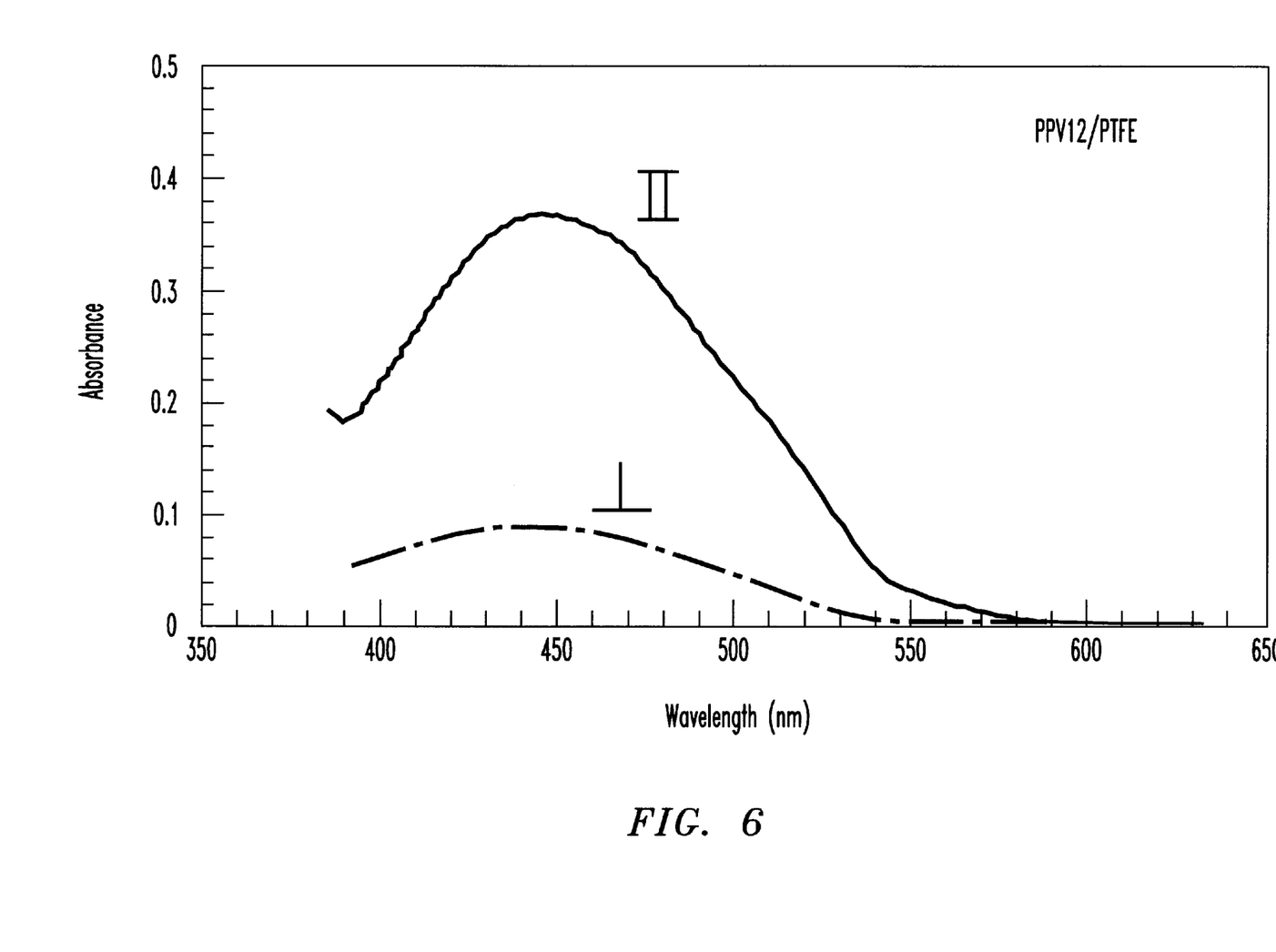
FIG. 6 shows the parallel and perpendicular absorption spectra of a PPV12 film cast on a substrate with a friction transferred PTFE alignment layer.
Figure 7:
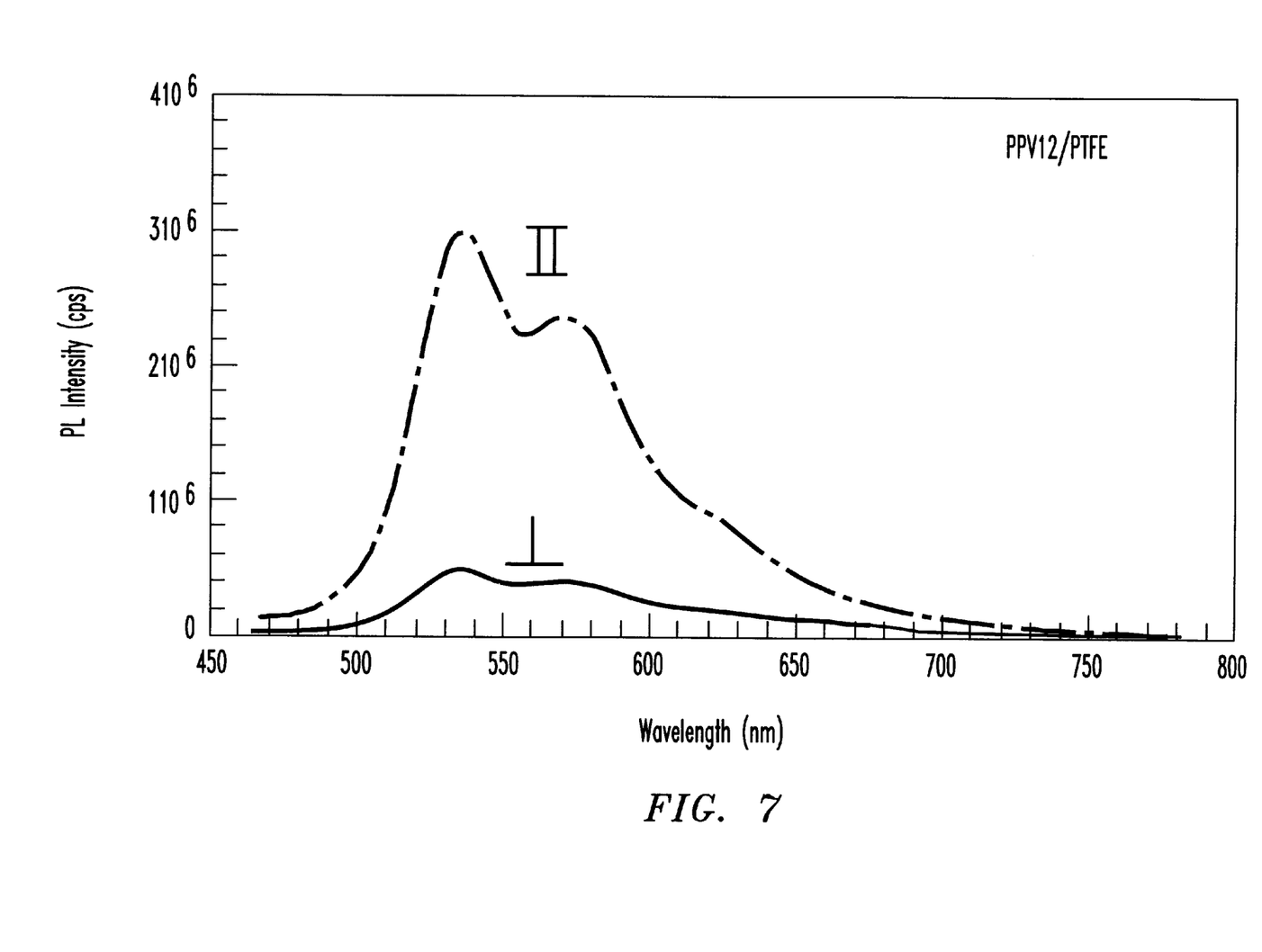
FIG. 7 shows the parallel and perpendicular photoluminescence spectra of a PPV12 film cast on a substrate with a friction transferred PTFE alignment layer.

FIGS. 6 and 7 show the parallel and perpendicular absorption and photoluminescence spectra from thin films cast from PPV12/chloroform solution on PTFE rubbed glass substrates. Intensities of absorption and emission along the friction transfer direction (parallel) are much higher than those obtained from the perpendicular direction. The ratios between the parallel and perpendicular are 4.1 to 1 and 6.7 to 1 for absorption and emission, respectively. Energy transfer in the film after photoexcitation probably causes the difference between the two ratios.

Each material deposited on the PTFE treated substrates exhibits polarization-dependent UV-vis absorption and fluorescence. The intensity was in every case maximum when the electric field vector was parallel to the PTFE friction transfer direction, indicating that the conjugated backbones were preferentially aligned along the PTFE chain axis. The effect of the side chains of the photoactive material on the alignment was studied by polarized absorption and fluorescence spectroscopies. In-plane dichroic ratios (intensity parallel vs. perpendicular) for four polymers measured after being prepared according the method described in this example are listed in Table I. The structures of these polymers are depicted in FIG. 4. All polarized photoactive polymer films were prepared according to the method of this example. The thickness of each polymer film was approximately 100 nm. From Table I, it is apparent that fewer and smaller side chains leads to greater anisotropy, which is indicative of a greater degree of photoactive material alignment and orientation the film gets. The highest anisotropy was obtained in the thin film of PPV12.

TABLE I

Dichroic absorption and photo luminescence ratios for polymers cast on PTFE treated substrates

| Polymer | Dichroic Ratio | |
| --- | --- | --- |
|  | Absorption | Photoluminescence |
| PPV12 | 4.1 | 6.7 |
| 1G6-OMe | 3 | 4.2 |
| 1G12-S | 2.7 | 3.3 |
| 2G6-S | 1.6 | 1.7 |

EXAMPLE 2

This example demonstrates how the process of preparing polarized photoactive layers is used to yield a polarized organic light-emitting device. First, an indium-tin-oxide (ITO) coated substrate, heated to 200° C., was rubbed as per the friction transfer method with a solid piece of PTFE. Second, a thin film of photoactive material 1G6-OMe was prepared by casting solutions of the photoactive material in chloroform or tetrahydrofuran onto the preheated (100° C.) substrate. The synthesis of this photoactive material, and others used herein, has been reported elsewhere. The film thickness of the active material was approximately 100 nm, as measured by a profilometer with 1 nm resolution and confirmed with optical absorption measurements. The multilayer structure was dried in a vacuum oven at 60° C. for 24 hours. Finally, 100–130 nm thick aluminum electrodes were vacuum evaporated (at $10^{-6}$ Torr) onto the active layer. The structure of this device is shown schematically in FIG. 1.

Figure 8:
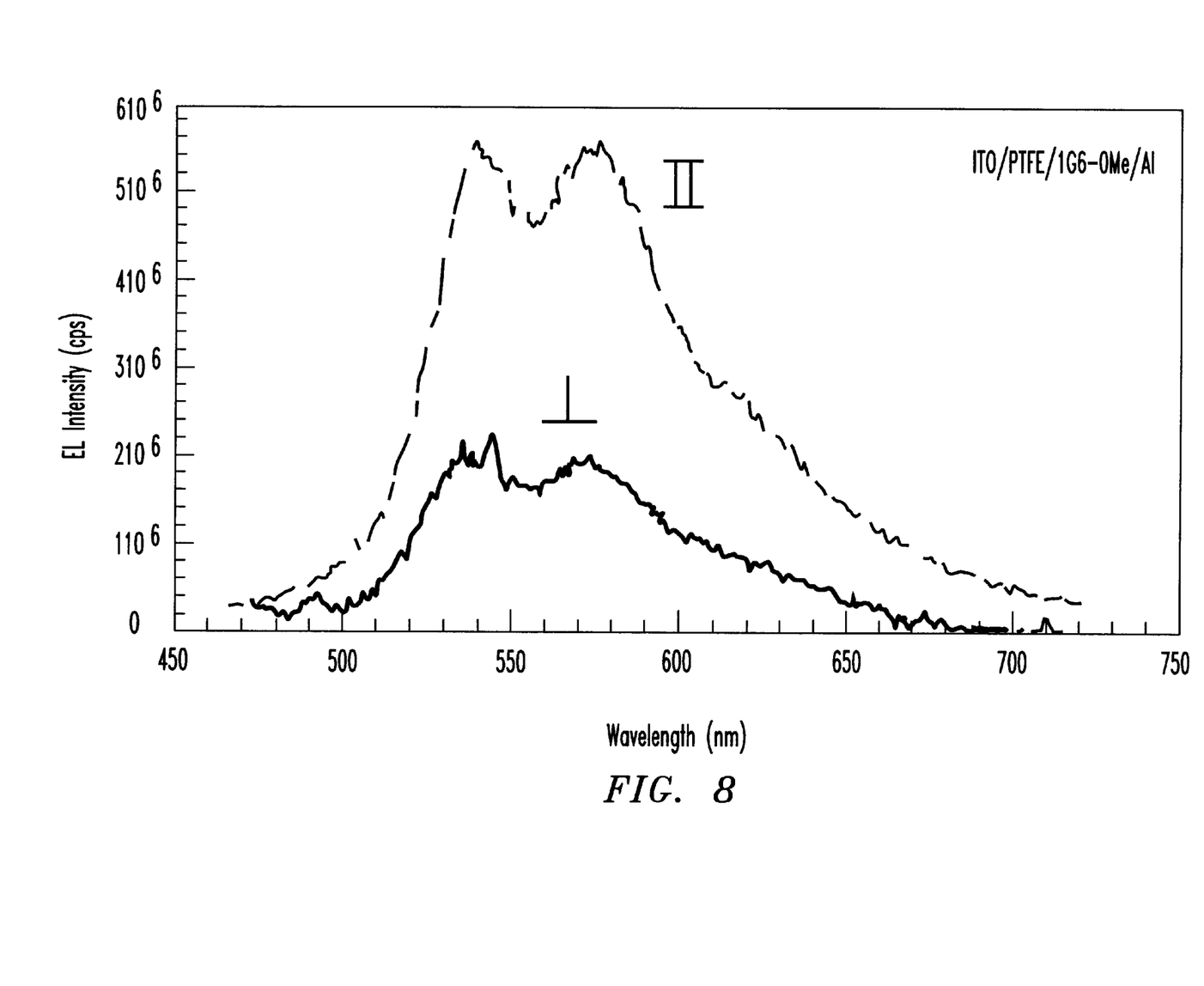
FIG. 8 shows the parallel and perpendicular electroluminescence spectra of one embodiment of the invention as an LED using 1G6-OMe as the photoactive material.

FIG. 8 shows the electroluminescence (EL) spectra of this device. As described in the fabrication steps above, the sequence of layers is: ITO/PTFE/1G6-OMe/Al. The EL measurement was made in the ambient environment and at room temperature. The measurement was taken in sequence such that the EL measurement from parallel direction was taken after the measurement from the perpendicular direction. The lineshape of the EL spectrum is identical to both the photoluminescence (PL) spectrum and a non-aligned, unpolarized LED with layers in the sequence of ITO/1G6-OMe/Al, indicating that the PL and EL are from the same species. An anisotropy (ie. ratio intensity parallel to perpendicular) of 2.6 in EL was achieved with the aligned, polarized photonics device of this example.

EXAMPLE 3

This example demonstrates the relative enhancement of the preferred embodiment that includes a layer of conducting polymer interposed between the alignment layer and the photoactive layer. This example further demonstrates that, as unique from all prior art, friction transfer alignment layers can induce alignment in organic and polymeric layers even when an additional organic layer is interposed between them. Under conditions essentially identical to those of Example 2, it was found that devices with a PEDOT layer interposed between the PTFE and the photoactive material have superior performance in terms of stability, quantum efficiency, and brightness. A device of this structure is shown schematically in FIG. 2. Devices with the structure ITO/PTFE/PEDOT/1G6-OMe/Al have comparable quantum efficiency ($2.0 \times 10^{-3}$) to unoriented LED devices without PTFE treatment such as ITO/PEDOT/1G6-OMe/Al (quantum efficiency $2.2 \times 10^{-3}$). Devices with a PTFE alignment layer but without the addition of a conducting polymer layer, such as ITO/PTFE/1G6-OMe/Al, have lower efficiency ($1.0 \times 10^{-3}$). These results, along with those of Example 2, suggest (1) current can pass though PTFE layers, probably by tunneling; and (2) PEDOT helps current injection and improves EL performance.

EXAMPLE 4

This example illustrates one of the preferred embodiments of the invention wherein the polarized organic photonics device is a polarized organic photovoltaic device. In this embodiment, the active materials here can be a single component, blends or multilayers, and can be aligned with the help of PTFE layer. In FIG. 3 the light absorbing active materials sandwiched between two conducting electrodes, at least one of which should be transparent or semitransparent (for light to pass). Although not intended to be limited by theory, when the light is shined on the device (through the transparent electrode), the absorbed light energy (absorbed by active materials) first results in the highly efficient generation of excitons (electron-hole pair) in the bulk film of the photoactive material. Due to the concentration gradient, these excitons diffuse to a contact, impurity, interface (between component if single layer blend) or organic/organic interface (if multilayer), at which point they dissociate into free carriers. Charge separation is followed by carriers transport to the contacts, which can then be collected in the external circuit (because of the potential difference between the two electrodes). In the device configuration of FIG. 3, the active material is aligned along a certain direction defined by the friction transfer deposition of the alignment layer. The response to light polarized in this direction is stronger than other directions and absorption of more light leads to greater electrical signals. Table I contains the anisotropic absorption ratio for a number of active materials deposited on a friction transferred alignment layer. Therefore, this device is more sensitive than others since all chromophores can take part in absorbing light, in contrast to a device with randomly orientated chromophores where only light parallel to dipole moment of chromophores gets absorbed. Furthermore, the device described in this example can detect the polarization of the light.

The materials for the first electrodes in this device may be ITO, Au, Ni, and other semitransparent or transparent conducting materials. Materials suitable for the second electrode include any conducting materials, and need not necessarily be transparent. For applications such as photovoltaic devices, it is preferred that the two electrodes have different work functions. Materials for photoactive layer may be, for a single layer, a PPV12-$C_{60}$ blend. For a bilayer device, a suitable sequence of layers and materials is, for example: ITO/PTFE/p-type materials (e.g. PPV12)/n-type materials (e.g. PTCDA)/Al. In this configuration, because the work function of ITO is greater than that of Al electrons will go to the Al electrode and holes will go to the ITO electrode. Alternately, the configuration could be: ITO/PTFE/PPV12-n-type materials blend (e.g. $C_{60}$)/p-type materials (e.g. TAPC)/Au. In this configuration, since the work function of Au is greater than that of ITO electrons will go to the ITO electrode and holes will go to Au electrode.

It is understood that various other modifications will be apparent to and can be readily made by those skilled in the art without departing from the scope and spirit of this invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A polarized organic photonics device, which comprises a sequence of stacked layers including:
   (a) a first layer having an outer surface, and comprising a first electrically conductive material;
   (b) a second layer having an outer surface, and comprising an oriented alignment material on said outer surface of the first layer;
   (c) a third layer having an outer surface, and comprising a layer of a photoactive material on said outer surface of the second layer, said material being aligned parallel to the outer surface of the first layer; and
   (d) a fourth layer comprising a second electrically conducting material on said outer surface of and in electrical contact with the photoactive material.

2. A polarized organic photonics device as claimed in claim 1,
   wherein at least one of the electrically conducting materials is transparent or semi-transparent to light.

3. A polarized organic photonics device as claimed in claim 2,
   wherein at least one of the electrically conducting materials is indium tin oxide, a thin metallic film, or an optically transparent conducting polymer.

4. A polarized organic photonics device as claimed in claim 1,
   wherein the first and second electrically conducting materials have different work functions.

5. A polarized organic photonics device as claimed in claim 1,
   wherein the first electrically conductive material is prepared on a substrate.

6. A polarized organic photonics device as claimed in claim 5,
   wherein the substrate is transparent or semi-transparent to light.

7. A polarized organic photonics device as claimed in claim 5,
   wherein the substrate is substantially planar.

8. A polarized organic photonics device as claimed in claim 5,
   wherein the substrate is concave or convex.

9. A polarized organic photonics device as claimed in claim 1,
   wherein the alignment material has an average thickness of less than about ten nanometers.

10. A polarized organic photonics device as claimed in claim 9,
    wherein the alignment material has an average thickness of less than about one nanometer.

11. A polarized organic photonics device as claimed in claim 1,
    wherein the alignment material is selected from the group consisting of poly(tetrafluoroethylene), poly (phenylene), polyethylene, poly(dimethylsilane), poly (diethylsilane), poly(di-n-hexylsilane), poly(di-n-butylsilane), and poly(methylphenylsilane).

12. A polarized organic photonics device as claimed in claim 1,
    wherein the third layer comprises a blend or sequence of stacked layers of one or more photoactive materials.

13. A polarized organic photonics device as claimed in claim 1,
    wherein the photoactive material comprises a photoactive material layered in a stacked sequence with a hole transporting material and/or an electron transporting material, the one or more transporting materials being adjacent to the photoactive material.

14. A polarized organic photonics device as claimed in claim 1,
    wherein the photoactive material is an organic or polymeric material.

15. A polarized organic photonics device as claimed in claim 14,
    wherein the photoactive polymeric material is a rigid, linear conjugated polymer.

16. A polarized organic photonics device as claimed in claim 14,
    wherein the photoactive material is a member of the group consisting of poly{[2,5-bis(n-dodecan-1-yloxy)-1,4- phenylene]vinylene-1,4-phenylene vinylene}, poly{{2-methoxy-5-[3',4',5'-tris(n-dodecan-1-yloxy) benzyloxy]-1,4-phenylene}vinylene-1,4-phenylene vinylene}, poly{{2-methoxy-5-[3',4',5'-tris(n-hexan-1-yloxy)benzyloxy]-1,4-phenylene}vinylene-1,4-phenylene vinylene}, poly{{2,5-bis[3',4',5'-tris(n-dodecan-1-yloxy)benzyloxy]-1,4-phenylene}vinylene-1,4-phenylene vinylene}, 1,2-bis(di-4-tolylaminophenyl)cyclohexane and 3,4,9,10-perylenetetracarboxylic dianhydride.

17. A polarized organic photonics device as claimed in claim 1,
wherein the photoactive material is blended or layered in a stacked sequence with fullerenes, substituted fullerenes, fullerene derivatives, polymers comprising fullerenes or substituted fullerenes.

18. A polarized organic photonics device as claimed in claim 1,
wherein the photoactive material is contacted with the outer surface of the alignment material in a gaseous phase or as an aerosol, from a solution by a casting method, or as a solid by melt processing.

19. A polarized organic photonics device as claimed in claim 1,
wherein the alignment material is heated when the photoactive material is contacted with the outer surface of the alignment layer.

20. A polarized organic photonics device as claimed in claim 19,
wherein the alignment material is heated to a temperature above the boiling point of a solvent used when the photoactive material is in solution when contacted with the alignment layer.

21. A polarized organic photonics device as claimed in claim 1,
further comprising a layer of an electrically conducting polymer formed on the outer surface of the alignment layer by contacting a conducting polymer with the alignment material prior to forming a layer of the photoactive material.

22. A polarized organic photonics device as claimed in claim 21,
wherein the formation of the conducting polymer on the outer surface of the alignment material is carried out using a gaseous-phase, aerosol, casting, or melt method.

23. A polarized organic photonics device as claimed in claim 21,
wherein the conducting polymer is poly(3,4-ethylenedioxythiophene, polyaniline, polypyrrole, or conducting polythiophene.

24. A polarized organic photonics device, which comprises a sequence of stacked layers including:
(a) a first layer having an outer surface, and comprising a first electrically conductive material;
(b) a second layer having an outer surface, and comprising an oriented alignment material on said outer surface of the first layer;
(c) a third layer having an outer surface, and comprising a conducting polymer oriented parallel to the outer surface of said first layer, on said outer surface of the second layer;
(d) a fourth layer having an outer surface, and comprising an oriented layer of a photoactive material on said outer surface of the third layer; and
(e) a fifth layer comprising of a second electrically conducting material on an outer surface of and in electrical contact with the fourth layer.

25. A liquid crystal display having a means of illumination, comprising a polarized light emitting diode for back-lighting, said light emitting diode comprising the polarized organic photonics device of claim 1.

26. A liquid crystal display having a means of illumination, comprising a polarized light emitting diode for back-lighting, said light emitting diode comprising the polarized organic photonics device of claim 24.

27. A photodetector having a means of detecting light, comprising a polarized photovoltaic device for detection of polarized light, said polarized photovoltaic device comprising the polarized organic photonics device of claim 1.

28. A photodetector having a means of detecting light, comprising a polarized photovoltaic device for detection of polarized light, said polarized photovoltaic device comprising the polarized organic photonics device of claim 24.

29. A polarized organic photonics device according to claim 1,
said device selected from the group consisting of a light emitting diode and a photovoltaic device.

30. A polarized organic photonics device according to claim 24,
said device selected from the group consisting of a light emitting diode and a photovoltaic device.

31. A polarized organic photonics device as claimed in claim 1,
wherein the third layer comprises a layer of hole transporting material and a layer of an electron transporting material,
wherein one of said hole transporting material or said electron transporting material layers comprises a photoactive material.

* * * * *